(12) United States Patent
Zhou

(10) Patent No.: US 11,996,469 B2
(45) Date of Patent: May 28, 2024

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 179 days.

(21) Appl. No.: 17/313,230

(22) Filed: May 6, 2021

(65) Prior Publication Data

US 2022/0052185 A1 Feb. 17, 2022

(30) Foreign Application Priority Data

Aug. 14, 2020 (CN) .......................... 202010819897.6

(51) Int. Cl.
*H01L 29/66* (2006.01)
*H01L 21/02* (2006.01)

(52) U.S. Cl.
CPC .... *H01L 29/66795* (2013.01); *H01L 21/0228* (2013.01); *H01L 29/6653* (2013.01)

(58) Field of Classification Search
CPC ......... H01L 29/66795; H01L 29/66439; H01L 27/0924; H01L 21/823431
See application file for complete search history.

(56) References Cited

U.S. PATENT DOCUMENTS 5,795,830 A * 8/1998 Cronin ................ H01L 21/0338
438/712
11,164,942 B1 * 11/2021 Weckx ............. H01L 21/31111
(Continued)

*Primary Examiner* — Tuan A Hoang
(74) *Attorney, Agent, or Firm* — Crowell & Moring LLP

(57) ABSTRACT

A semiconductor structure and a method for forming the same are provided. One form of a method for forming a semiconductor structure includes: providing a base, the base including a first device region and a second device region, the base including an initial substrate and one or more initial channel stacks located on the initial substrate, and the initial channel stack including a sacrificial material layer and a channel material layer located on the sacrificial material layer; forming a discrete combined pattern on the initial channel stack, the combined pattern including a mandrel layer and a spacer layer located on a side wall of the mandrel layer, and the combined pattern exposing a boundary between the first device region and the second device region; forming a dielectric wall running through the initial channel stack at the boundary between the first device region and the second device region; and removing the mandrel layer. In embodiments and implementations of the present disclosure, the spacer layer has good uniformity, and the initial channel stack is etched by using the spacer layer as a mask to form a separate channel stack which has good morphology uniformity, which is conducive to improving the uniformity of the semiconductor structure performance.

16 Claims, 6 Drawing Sheets

(56) References Cited

U.S. PATENT DOCUMENTS

| | | | |
|---|---|---|---|
| 2011/0097863 A1* | 4/2011 | Shieh | H01L 21/823431 257/E21.409 |
| 2014/0319623 A1* | 10/2014 | Tsai | H01L 21/823431 438/588 |
| 2021/0210489 A1* | 7/2021 | Zhang | H01L 27/0924 |
| 2021/0305412 A1* | 9/2021 | Chan | H01L 29/0649 |

* cited by examiner

SEMICONDUCTOR STRUCTURE AND METHOD FOR FORMING THE SAME

RELATED APPLICATIONS

The present application claims priority to Chinese Patent Appln. No. 202010819897.6, filed Aug. 14, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

In semiconductor manufacturing, with the development tendency of ultra-large-scale integrated circuits, a characteristic dimension of an integrated circuit continually decreases. To be adapted to a smaller characteristic dimension, a channel length of a metal-oxide-semiconductor field-effect transistor (MOSFET) also continually decreases. However, as a channel length of a device becomes smaller, a distance between a source and a drain of the device decreases. Therefore, a channel control capability of a gate structure deteriorates, and there is increasing difficulty in pinching the channel off by a gate voltage, resulting in a greater possibility of subthreshold leakage, that is, the so-called short-channel effect (SCE).

Therefore, to better meet a requirement of proportional reduction in a device size, the semiconductor process gradually transitions from a planar transistor to a three-dimensional transistor with higher efficacy, such as a gate-all-around (GAA) transistor. In the metal gate-all-around transistor, a gate surrounds a region in which a channel is located. Compared with the planar transistor, the gate of the metal gate-all-around transistor has a stronger channel control capability and can better suppress the SCE.

Full gate nanowires may be obtained by adding only two process modules to an existing alternative fin field effect transistor (FinFET) process flow. The two process modules are as follows: one is to grow a layer of silicon on bulk silicon or SOI wafers, which can avoid leakage of the bulk silicon material. The other is to selectively remove silicon germanium from a replaceable metal gate loop, and then use HKMG (high-k insulating layer+metal gate) to stack and surround the silicon channel to form a fully surrounded metal gate transistor.

SUMMARY

A problem to be address in embodiments and implementations of the present disclosure is to provide a semiconductor structure and a method for forming the same, so as to optimize the electrical performance of the semiconductor structure.

To address the foregoing problem, one form of the present disclosure provides a method for forming a semiconductor structure, including: providing a base, the base including a first device region and a second device region, the base including an initial substrate and an initial channel stacks located on the initial substrate, the initial channel stack including a sacrificial material layer and a channel material layer located on the sacrificial material layer; forming a discrete combined pattern on the initial channel stack, the combined pattern including a mandrel layer and a spacer layer located on a side wall of the mandrel layer, and the combined pattern exposing a boundary between the first device region and the second device region; after the combined pattern is formed, forming a dielectric wall running through the initial channel stack at the boundary between the first device region and the second device region; after the dielectric wall is formed, removing the mandrel layer; and etching the initial channel stack using the spacer layer as a mask to form a separate channel stack, the separate channel stack including a sacrificial layer and a channel layer located on the sacrificial layer.

Another form of the present disclosure provides a semiconductor structure, including: an initial substrate, the initial substrate including a first device region and a second device region; an initial channel stack, located on the initial substrate; a dielectric wall, running through the initial channel stack at a boundary between the first device region and the second device region; and a spacer layer, separated on the initial channel stack, the spacer layer exposing the dielectric wall.

Compared with the prior art, technical solutions in embodiments and implementations of the present disclosure have the following advantages:

In implementations of a method for forming a semiconductor structure provided in the present disclosure, the base includes a first device region and a second device region, and the base includes an initial substrate and one or more initial channel stacks located on the initial substrate. A discrete combined pattern is formed on the initial channel stack, the combined pattern includes a mandrel layer and a spacer layer located on a side wall of the mandrel layer, and the combined pattern exposes a boundary between the first device region and the second device region. The spacer layers are located on the side wall of the mandrel layer, and the uniformity of the spacer layer is relatively high. A dielectric wall running through the initial channel stack at the boundary between the first device region and the second device region is formed, the dielectric wall separates the initial channel stack of the first device region and the second device region, and the initial channel stack covered by the combined pattern is not easily damaged. After the dielectric wall is formed, the initial channel stack is etched using the spacer layer as a mask to form a separate channel stack. The separate channel stack is formed using the spacer layer as a mask, and thus the separate channel stack has good morphology uniformity, which is conducive to improving the uniformity of the semiconductor structure performance.

DETAILED DESCRIPTION

As will be appreciated from the background, current devices with conventionally formed semiconductor structures have a poor performance problem. The reason for the poor performance of the device is analyzed with reference to a method for forming a semiconductor structure.

FIG. 1 to FIG. 4 are schematic structural diagrams corresponding to each step in a method for forming a semiconductor structure.

Figure 1:
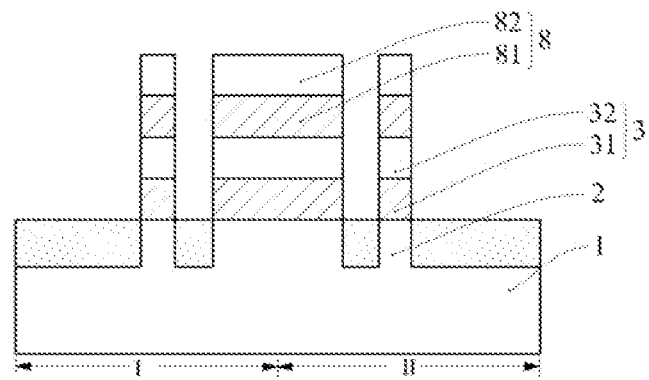
FIG. 1 to FIG. 4 are schematic structural diagrams corresponding to steps in a method for forming a semiconductor structure.

As shown in FIG. 1, a base is provided. The base includes a first device region I for forming a first-type transistor thereon and a second device region II for forming a second-type transistor thereon. The base includes a substrate 1, a separate fin 2 located on the substrate 1 and a channel stack material layer 8 located on the fin 2. The channel stack material layer 8 includes a sacrificial material layer 81 and a channel material layer 82 located on the sacrificial material layer 81. The channel stack material layer 8 is etched to form a channel stack 3 in the first device region I and the second device region II. The channel stack 3 includes a sacrificial layer 31 and a channel layer 32 located on the sacrificial layer 31, where the channel stack material layer 8 exists at a boundary between the first device region I and the second device region II.

Figure 2:
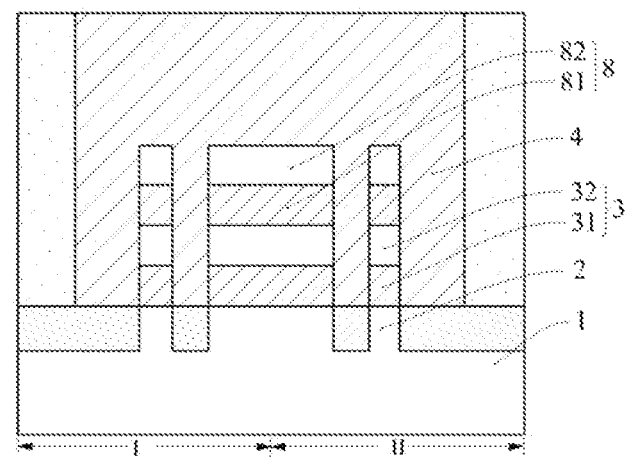

As shown in FIG. 2, a dummy gate structure 4 across the channel stack 3 is formed, where the dummy gate structure 4 covers part of a top wall and part of a side wall of the channel stack 3, an extension direction of the dummy gate structure 4 is perpendicular to an extension direction of the channel stack 3, and the extending direction of the dummy gate structure 4 is a lateral direction. A source/drain doped layer is formed in the channel stacks 3 on two sides of the dummy gate structure 4.

Figure 3:
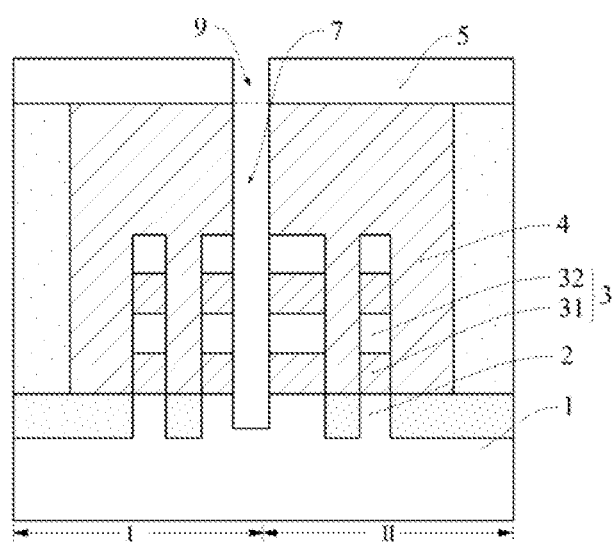

As shown in FIG. 3, a photoresist material layer is formed on the dummy gate structure 4, the photoresist material layer is exposed to light, an opening 9 is formed in the photoresist material layer, and the remaining photoresist material layer is used as a photoresist layer 5. The dummy gate structure 4, the channel stack material layer 8 and a partial thickness of the fin 2 at the boundary between the first device region I and the second device region II are etched using the photoresist layer 5 as a mask to form a groove 7. The remaining channel stack material layer 8 is used as a channel stack 3.

Figure 4:
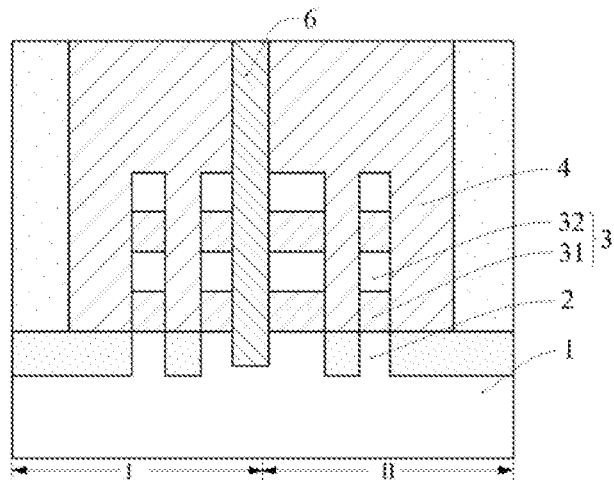

As shown in FIG. 4, a dielectric material is filled in the groove 7 to form a dielectric wall 6.

After the source/drain doped layer is formed, a dielectric wall 6 is formed in the first device region I and the second device region II, so that the source/drain doped layer in the first device region I and the source/drain doped layer in the second device region II are difficult to bridge, which is conducive to improving the electrical performance of the semiconductor structure. However, due to the impact of an overlay error in the process of forming the photoresist layer 5, the opening 9 is likely to deviate toward the first device region I or the second device region II, resulting in the formed groove 7 deviating toward the first device region I or the second device region II, that is, a lateral dimension of the channel stack 3 at the boundary between the first device region I and the second device region II has large differences from that of the channel stack 3 formed before the dummy gate structure 4 is formed, resulting in poor device uniformity of the semiconductor structure.

To address the technical problem, one form of the present disclosure provides a method for forming a semiconductor structure, including: providing a base, the base including a first device region and a second device region, the base including an initial substrate and one or more initial channel stacks located on the initial substrate, and the initial channel stack including a sacrificial material layer and a channel material layer located on the sacrificial material layer; forming a discrete combined pattern on the initial channel stack, the combined pattern including a mandrel layer and a spacer layer located on a side wall of the mandrel layer, and the combined pattern exposing a boundary between the first device region and the second device region; after the combined pattern is formed, forming a dielectric wall running through the initial channel stack at the boundary between the first device region and the second device region; after the dielectric wall is formed, removing the mandrel layer; and etching the initial channel stack using the spacer layer as a mask to form a separate channel stack, the channel stack including a sacrificial layer and a channel layer located on the sacrificial layer.

In implementations of the method for forming a semiconductor structure provided in this form of the present disclosure, the base includes a first device region and a second device region, and the base includes an initial substrate and one or more initial channel stacks located on the initial substrate. A discrete combined pattern is formed on the initial channel stack, the combined pattern includes a mandrel layer and a spacer layer located on a side wall of the mandrel layer, and the combined pattern exposes a boundary between the first device region and the second device region. The spacer layers are located on the side wall of the mandrel layer, and the uniformity of the spacer layer is relatively high. A dielectric wall running through the initial channel stack at the boundary between the first device region and the second device region is formed, the dielectric wall separates the initial channel stack of the first device region and the second device region, and the initial channel stack covered by the combined pattern is not easily damaged. After the dielectric wall is formed, the initial channel stack is etched by using the spacer layer as a mask to form a separate channel stack. The channel stack is formed using the spacer layer as a mask, and thus the channel stack has good morphology uniformity, which is conducive to improving the uniformity of the semiconductor structure performance.

To make the foregoing objectives, features, and advantages of the embodiments of the present disclosure more apparent and easier to understand, specific embodiments and implementations of the present disclosure are described in detail below with reference to the accompanying drawings.

FIG. 5 to FIG. 17 are schematic structural diagrams corresponding to steps in one form of a method for forming a semiconductor structure according to an embodiment of the present disclosure.

Figure 5:
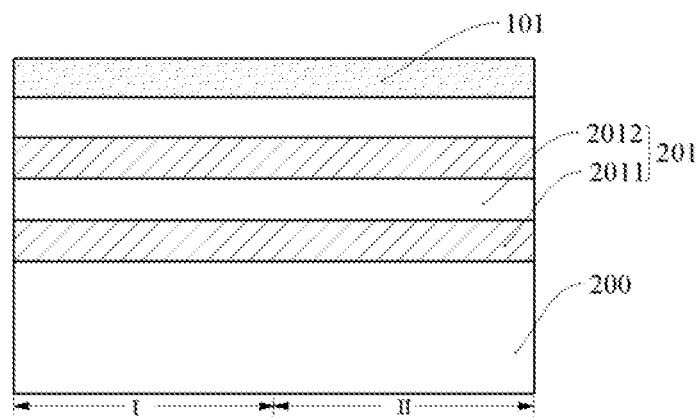
FIG. 5 to FIG. 17 are schematic structural diagrams corresponding to steps in one form of a method for forming a semiconductor structure according to an embodiment of the present disclosure.

Referring to FIG. 5, a base is provided that includes a first device region I and a second device region II. The base includes an initial substrate 200 and one or more initial channel stacks 201 located on the initial substrate 200, where the initial channel stack 201 includes a sacrificial material layer 2011 and a channel material layer 2012 located on the sacrificial material layer 2011.

In some implementations, the first device region I is used for forming a first-type transistor thereon, and the second device region II is used for forming a second-type transistor thereon. Conductivity types of the first-type transistor and the second-type transistor are different. Specifically, the first-type transistor is a positive channel metal oxide semiconductor (PMOS), and the second-type transistor is a negative channel metal oxide semiconductor (NMOS).

The initial substrate 200 is prepared for the subsequent formation of a substrate.

In some implementations, the initial substrate 200 is a silicon substrate. In other implementations, a material of the initial substrate may also be another material such as germanium, silicon germanium, silicon carbide, gallium arsenide, or indium gallium. The initial substrate may alternatively be an initial substrate of another type, including a silicon initial substrate on an insulator or a germanium initial substrate on an insulator.

The initial channel stack 201 is prepared for the subsequent formation of a channel stack. Specifically, the channel material layer 2012 is prepared for the subsequent formation of a channel layer, and the sacrificial material layer 2011 is prepared for the subsequent formation of a sacrificial layer.

In some implementations, the etching difficulty of the channel material layer 2012 is greater than that of the sacrificial material layer 2011. The channel material layer 2012 is subsequently etched to form the channel layer, and the sacrificial material layer 2011 is etched to form the sacrificial layer. When the sacrificial layer is removed, the channel layer is not easily damaged.

In some implementations, a material of the channel material layer 2012 is silicon. A material of the sacrificial material layer 2011 is silicon germanium. In other implementations, the material of the channel material layer may alternatively be another material such as germanium, silicon germanium, silicon carbide, gallium arsenide, or indium gallium, and the material of the sacrificial material layer may alternatively correspondingly be silicon.

It should be noted that in the step of providing the base, a mask layer 101 is formed on the initial channel stack 201.

In the subsequent step of forming a dielectric wall running through the initial channel stack 201 at the boundary between the first device region I and the second device region II, the mask layer 101 protects a top of the initial channel stack 201 from being damaged easily, and the top of the initial channel stack 201 is a channel material layer 2012. The channel material layer 2012 is subsequently etched to form a channel layer, and the corresponding channel layer is not easily damaged.

Specifically, a material of the mask layer 101 includes one or more of silicon nitride, silicon oxynitride, silicon carbide, silicon carbonitride, boron nitride, boron nitride silicon, and boron carbon silicon nitride. In some implementations, the material of the mask layer 101 includes silicon nitride.

Figure 6:
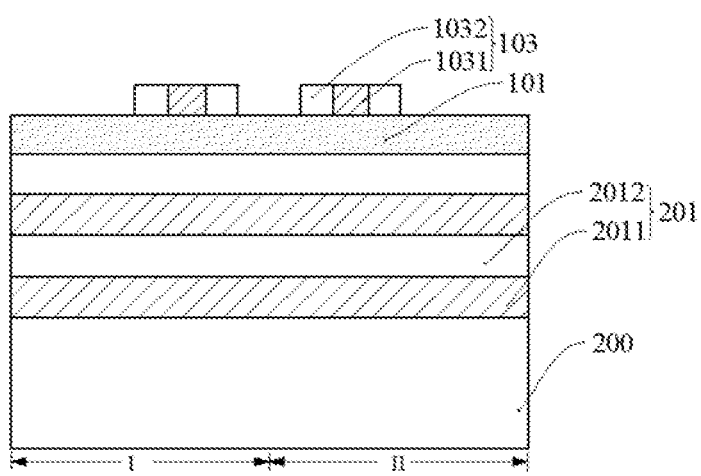

Referring to FIG. 6, a discrete combined pattern 103 is formed on the initial channel stack 201. The combined pattern 103 includes a mandrel layer 1031 and a spacer layer 1032 located on a side wall of the mandrel layer 1031, and the combined pattern 103 exposes the boundary between the first device region I and the second device region II.

The mandrel layer 1031 provides a process basis for forming the spacer layer 1032.

In some implementations, a material of the mandrel layer 1031 includes amorphous silicon. In other implementations, the material of the mandrel layer may alternatively be silicon oxide or silicon nitride.

The spacer layer 1032 is used as a mask layer for subsequent etching of the initial channel stack 201 to form the channel stack. The spacer layers 1032 are all located on the side wall of the mandrel layer 1031, and the spacer layer 1032 has high uniformity.

In the subsequent step of removing the mandrel layer 1031, the etching difficulty of the spacer layer 1032 is greater than that of the mandrel layer 1031.

Specifically, a material of the spacer layer 1032 includes one or more of silicon nitride, silicon oxynitride, silicon carbide, silicon carbonitride, boron nitride, boron nitride silicon, and boron carbon silicon nitride. In some implementations, the material of the spacer layer 1032 includes silicon nitride.

The step of forming the combined pattern 103 includes: forming a mandrel material layer on the initial channel stack 201; patterning the mandrel material layer, to form a separate mandrel layer 1031; forming a spacer material layer (not shown in the figure) on the mandrel layer 1031 and the initial channel stack 201 exposed by the mandrel layer 1031; and removing the spacer material layer from a top of the mandrel layer 1031 and the spacer material layer on a surface of the initial channel stack 201, and using the remaining spacer material layer located on the side wall of the mandrel layer 1031 as the spacer layer 1032.

Specifically, the combined pattern 103 is formed on the mask layer 101 on the initial channel stack 201.

In some implementations, the spacer material layer is formed using an atomic layer deposition (ALD) process. The ALD process includes a plurality of times of atomic layer deposition cycles. The gap filling performance and the step coverage performance of the ALD process are good, and the conformal coverage capability of the spacer material layer is correspondingly improved, so that the spacer material layer can conformally cover the side wall and the top of the mandrel layer 1031 and the mask layer 101, which is conducive to improving the thickness uniformity of the spacer material layer. Correspondingly, the spacer layer 1032 obtained by removing the spacer material layer from the top of the mandrel layer 1031 and the spacer material layer on the surface of the initial channel stack 201 has relatively high uniformity, and the subsequent channel stack formed by etching the initial channel stack 201 by using the spacer layer 1032 as a mask has relatively high uniformity. In other implementations, the spacer material layer may alternatively be formed using a chemical vapor deposition (CVD) process.

Figure 7:
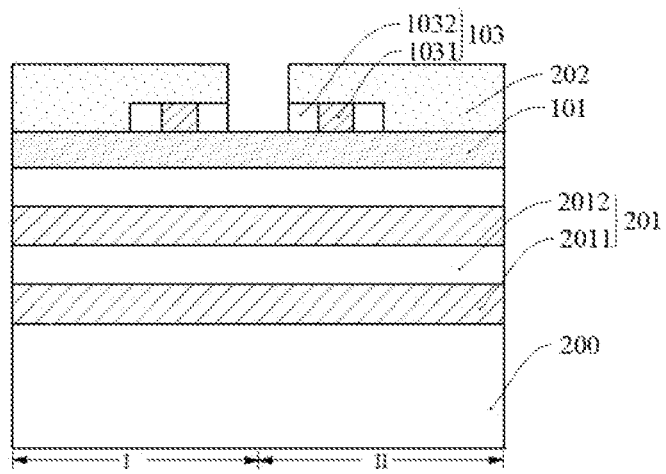
Figure 8:
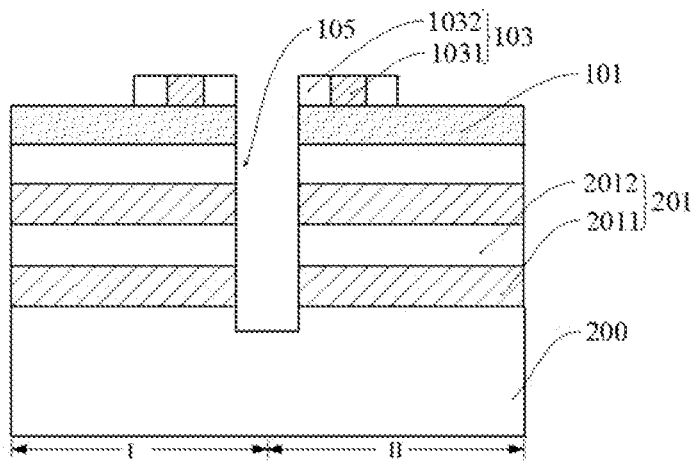
Figure 9:
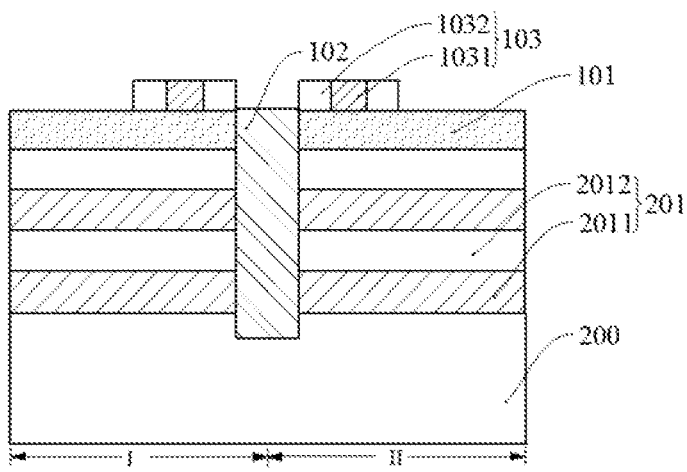

Referring to FIG. 7 to FIG. 9, after the combined pattern 103 is formed, a dielectric wall 102 running through the initial channel stack 201 at the boundary between the first device region I and the second device region II is formed.

The dielectric wall 102 running through the initial channel stack 201 at the boundary between the first device region I and the second device region II is formed, the dielectric wall 102 separates the initial channel stack 201 of the first device region I and the second device region II, and the initial channel stack covered by the combined pattern is not easily damaged. By using a direction that is parallel to the plane of the initial substrate 200 and that is perpendicular to an extension direction of the dielectric wall 102 as a lateral direction, the dielectric wall 102 is formed on the initial substrate 200 at the boundary of the first region I and the second region II, so that there is no need to reserve excessive lateral dimensions between the first-type transistor and the second-type transistor, which can improve the utilization of the plane of the initial substrate 200, and the integration of the semiconductor structure is relatively high, which is conducive to reducing the energy consumption of the semiconductor structure.

In some implementations, a material of the dielectric wall 102 is a low-k dielectric material. (The low-k dielectric material refers to a dielectric material with a relative dielectric constant greater than or equal to 2.6 and less than or equal to 3.9.) The low-k dielectric material has superior insulation performance, so that after the gate structure is replaced with a metal gate structure subsequently, the capacitive coupling effect between the metal gate structure in the first-type transistor and the metal gate structure in the second-type transistor is relatively weak, which is conducive to improving the electrical performance of the second-type transistor.

Specifically, the material of the dielectric wall 102 includes one or more of SiON, SiBCN, SiCN, carbon-doped SiN and oxygen-doped SiN. In some implementations, the material of the dielectric wall 102 includes carbon-doped SiN or oxygen-doped SiN.

It should be noted that in the step of forming the dielectric wall 102, the direction perpendicular to the extension direction of the dielectric wall 102 is the lateral direction. If the lateral dimension of the dielectric wall 102 is excessively large, an area of the initial substrate 200 of the semiconductor structure occupied by the dielectric wall 102 is excessively large, which is not conducive to improving the integration degree of the semiconductor structure. Correspondingly, when the semiconductor structure is working, the energy consumption of the semiconductor structure is not easily reduced. The initial channel stack 201 is subsequently etched to form a channel stack. The channel stack includes a sacrificial layer and a channel layer located on the sacrificial layer. The sacrificial layer is removed. After the sacrificial layer is removed, a metal gate structure that completely surrounds the channel layer is formed. The metal gate structure in the first device region I includes a first work function layer and a metal gate layer located on the first work function layer, and the metal gate structure in the second device region II includes a second work function layer and a metal gate layer located on the second work function layer. The first work function layer and the second work function layer are formed first, and then the metal gate layer is formed. The step of forming the first work function layer and the second work function layer includes: forming the first work function layer on a surface of the channel layer in the first device region I and the second device region II, removing the first work function layer from the second device region II, and forming the second work function layer on a surface of the channel layer in the second device region II. The step of removing the first work function layer from the second device region II usually includes: forming a work function mask layer covering the first device region I and exposing the second device region II, the work function mask layer also covering part or the entire of the dielectric wall 102. Even if there is an overlay error in the process of forming the work function mask layer, the work function mask layer is still easy to completely cover the first device region I and expose the second device region II, and the dielectric wall 102 enlarges a process window formed by the work function mask layer. In the process of removing the first work function layer from the second device region II, the first work function layer in the first device region I is not easily damaged, so that the formation quality of the first-type transistor is relatively good, the first work function layer in the second device region can be removed clearly, and the formation quality of the second work function layer formed in the second device region II is relatively good, and the formation quality of the corresponding second-type transistor is relatively good. Subsequently, a separate source/drain doped layer is formed in the channel stack. If the lateral dimension of the dielectric wall 102 is relatively small, the dielectric wall 102 cannot well separate the source/drain doped layer in the first device region I and the source/drain doped layer in the second device region II. It is easy to cause bridging between source/drain doped layer in the first device region I and source/drain doped layer in the second device region II; In addition, in the process of removing the first work function layer from the second device region II, if the formed work function mask layer has a slight overlay error, it is easy to remove the first work function layer from the first device region I by mistake, or it is easy to cause residues of the first work function layer in the second device region II, resulting in that a threshold voltage of the first-type transistor or the second-type transistor formed subsequently does not meet the process requirement. In some implementations, the lateral dimension of the dielectric wall 102 is 5 nm to 20 nm.

It should be noted that in the step of forming the dielectric wall 102 running through the initial channel stack 201 at the boundary between the first device region I and the second device region II, in a surface normal direction of the initial substrate 200, a side wall of the dielectric wall 102 is flush with a side wall of the spacer layer 103.

In the surface normal direction of the initial substrate 200, the side wall of the dielectric wall 102 is flush with the side wall of the spacer layer 103, which is conducive to improving the plane utilization of the surface of the initial substrate 200, improving the integration degree of the semiconductor structure, and reducing the energy consumption of the semiconductor structure.

Specifically, the step of forming the dielectric wall 102 includes: as shown in FIG. 7, forming a shielding layer 202 on the initial channel stack 201, the shielding layer 202 covering the combined pattern 103, and exposing the boundary between the first device region I and the second device region II.

The shielding layer 202 is a material that can function as a mask and is easy to remove, so that damage to the initial channel stack 201 is reduced when the shielding layer 202 is subsequently removed.

In some implementations, a material of the shielding layer 202 includes: a bottom anti-reflective coating (BARC) material, an organic dielectric layer (ODL) material, photoresist, a dielectric anti-reflective coating (DARC) material, a deep UV light absorbing oxide (DUO) material or an advanced patterning film (APF) material.

The step of forming the shielding layer 202 includes: forming a shielding material layer covering the combined pattern 103 and the initial channel stack 201; and exposing the shielding material layer to form the shielding layer 202.

In some implementations, the shielding material layer is formed using a spin coating process.

It should be noted that because the combined pattern 103 exposes the boundary between the first device region I and the second device region II, in the process of patterning the shielding material layer to form the shielding layer 202, even if there is an overlay error, causing the shielding layer 202 to expose part of the spacer layer 1032, in the subsequent process of etching the initial channel stack 201 using the shielding layer 202 as a mask, the spacer layer 1032 can also function as a mask, so that the opening formed in the initial channel stack meets the process requirement.

As shown in FIG. 8, the initial channel stack 201 is etched using the shielding layer 202 as a mask to form an opening 105 running through the initial channel stack 201.

The opening 105 provides space for forming the dielectric wall 102.

In some implementations, the initial channel stack 201 at the boundary between the first device region I and the second device region II is etched using the shielding layer 202 as a mask and using an anisotropic dry etching process to form an opening 105 running through the initial channel stack 201. The anisotropic dry etching process has anisotropic etching characteristics and has relatively good control performance of etching a profile, which is conducive to making the morphology of the opening 105 meet the process requirement. During the anisotropic dry etching process, by changing etching gas, the channel material layer 2012 and the sacrificial material layer 2011 in the initial channel stack 201 can be etched in a same etching device, which simplifies process steps.

It should be noted that in the step of etching the initial channel stack 201 at the boundary between the first device region I and the second device region II, a partial thickness of the initial substrate 200 is also etched, that is, a bottom surface of the opening 105 is lower than a top surface of the initial substrate 200.

The bottom surface of the opening 105 is lower than the top surface of the initial substrate 200, so that the dielectric wall subsequently formed in the opening 105 can better electrically isolate the initial channel stack 201 in the first device region I and the second device region II.

It should be noted that in the step of forming the opening 105, in a surface normal direction of the initial substrate 200, a side wall of the opening 105 is flush with a side wall of the spacer layer 1032.

In the surface normal direction of the initial substrate 200, the side wall of the opening 105 is flush with the side wall of the spacer layer 1032, and the corresponding side wall of the dielectric wall subsequently formed in the opening 105 and the side wall of the spacer layer 1032 are flush with the initial substrate 200 in the surface normal direction.

The method for forming a semiconductor structure further includes: removing the shielding layer 202 after the opening 105 is formed. The removal of shielding layer 202 is prepared for the subsequent formation of a dielectric wall in the opening 105.

In some implementations, the shielding layer 202 is removed using an ashing process.

As shown in FIG. 9, a dielectric material layer (not shown in the figure) is formed in the opening 105 and on the initial channel stack 201. The dielectric material layer exposing the opening 105 is removed, and the remaining dielectric material layer in the opening 105 is used as the dielectric wall 102.

In some implementations, the dielectric material layer is formed using an ALD process. The ALD process includes a plurality of times of atomic layer deposition cycles, which is conducive to improving the thickness uniformity of the dielectric material layer, so that the dielectric material layer can conformally cover the opening 105. In addition, the gap filling performance and the step coverage performance of the ALD process are good, which correspondingly improves the conformal coverage capability of the dielectric material layer, and reduces a probability that voids occur in the dielectric material layer. In other implementations, the dielectric material layer is formed by using a plasma chemical vapor deposition (PCVD|[TE1]) process.

In some implementations, the dielectric material layer exposing the opening is removed using a dry etching process. In the process of removing the dielectric material layer exposing the opening using the dry etching process, an etching rate of the dielectric material layer is greater than that of the mask layer 101. Therefore, the mask layer 101 is not easily damaged, and the corresponding initial channel stack 201 is not easily damaged.

It should be noted that, in the step of forming the dielectric wall 102, the dielectric wall 102 is further formed in the initial substrate 200. The dielectric wall 102 is located in the initial substrate 200, so that the first-type transistor and the second-type transistor have a good electrical isolation effect.

Figure 10:
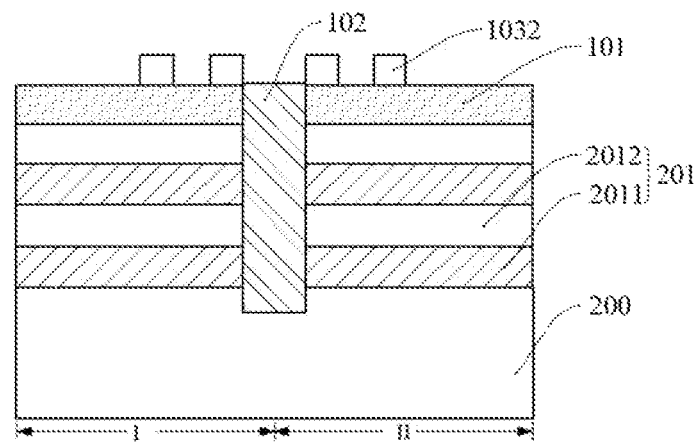

Referring to FIG. 10, after the dielectric wall 102 is formed, the mandrel layer 1031 is removed.

In this form of the present disclosure, a dielectric wall 102 running through the initial channel stack 201 at the boundary between the first device region I and the second device region II is formed, and the dielectric wall 102 isolates the initial channel stack 201 of the first device region I and the second device region II. After the dielectric wall 102 is formed, the initial channel stack 201 is etched using the spacer layer 1032 as a mask to form a separate channel stack. The channel stack is formed using the spacer layer 1032 as a mask, and thus the channel stack has good morphology uniformity, which is conducive to improving the uniformity of semiconductor structure performance.

The mandrel layer 1031 is removed to be prepared for the subsequent etching of the initial channel stack 201 by using the spacer layer 1032 as a mask to form the channel stack.

In some implementations, the mandrel layer 1031 is removed using a wet etching process. The wet etching process is an isotropic etching process, which has a relatively high etching rate, simple operation and low process costs. Specifically, a material of the mandrel layer 1031 includes amorphous silicon, and a corresponding wet etching solution includes tetramethylammonium hydroxide (TMAH) solution.

Figure 11:
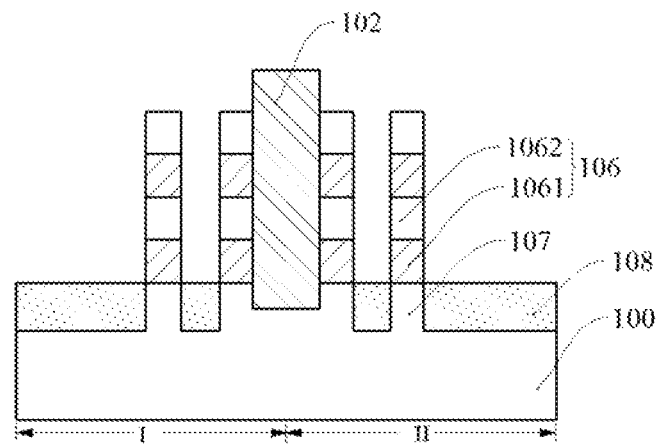

Referring to FIG. 11, the initial channel stack 201 is etched using the spacer layer 1032 as a mask to form a separate channel stack 106. The channel stack 106 includes a sacrificial layer 1061 and a channel layer 1062 located on the sacrificial layer 1061.

A separate mandrel layer 1031 and spacer layers 1032 located on a side wall of the mandrel layer 1031 are formed on the initial channel stack 201, and the combined pattern 103 exposes the boundary between the first device region I and the second device region II. The spacer layers 1032 are all located on the side wall of the mandrel layer 1031, and the spacer layer 1032 has relatively high uniformity. In the process of forming the dielectric wall 102, the initial channel stack 201 covered by the combined pattern 103 is not easily damaged. After the dielectric wall 102 is formed, the initial channel stack 201 is etched using the spacer layer 1032 as a mask to form a separate channel stack 106. The channel stack 106 is formed using the spacer layer 1032 as a mask, and thus the channel stack 106 has good morphology uniformity, which is conducive to improving the uniformity of the semiconductor structure performance.

The sacrificial layer 1061 is used for supporting the channel layer 1062 and providing process conditions for the subsequent dangling arrangement at intervals of the channel layer 1062, and is also used for occupying space for the subsequently formed metal gate structure. When the semiconductor structure is working, the channel layer 1062 is used as a channel.

In some implementations, the etching difficulty of the channel layer 1062 is greater than that of the sacrificial layer 1061. When the sacrificial layer 1061 is subsequently removed, the channel layer 1062 is not easily damaged.

In some implementations, the initial channel stack 201 is etched using the spacer layer 1032 as a mask and using the dry etching process to form a separate channel stack 106. The dry etching process has anisotropic etching characteristics and has relatively good control performance of etching a profile, which is conducive to making the morphology of the channel stack 106 meet the process requirement, and is also conducive to improving the removal efficiency of the initial channel stack 201. Moreover, by changing etching gas, the sacrificial material layer 2011 and the channel material layer 2012 can be etched in the same etching device, which simplifies process steps.

It should be noted that in the process of etching the initial channel stack 201 to form the separate channel stack 106, a partial thickness of the initial substrate 200 is also etched to form the substrate 100 and the fin 107 located on the substrate 100.

In the step of forming the channel stack 106, a partial thickness of the initial substrate 200 is etched to form the substrate 100 and the fin 107 located on the substrate 100, and the channel stack 106 is formed on the fin 107.

The substrate 100 on a side portion of the fin 107 provides space for the subsequent formation of an isolation layer.

The method for forming a semiconductor structure further includes: forming an isolation layer 108 on the substrate 100 on the side portion of the fin 107.

The isolation layer 108 is used to electrically isolate the substrate 100 from the subsequently formed metal gate structure.

In some implementations, a material of the isolation layer 108 is silicon oxide. Silicon oxide is a low-cost dielectric material commonly used in the process, and has relatively high process compatibility, which is conductive to reducing the process difficulty and process costs of forming the isolation layer 108. In addition, a dielectric constant of silicon oxide is relatively small, which is also conducive to improving the function of the subsequent isolation layer 108 for isolating adjacent devices. In other implementations, the material of the isolation layer 108 may alternatively be silicon nitride or silicon oxynitride.

It should be noted that in the step of forming the isolation layer 108, the mask layer 101 protects a top of the channel stack 106 from being damaged, and a corresponding channel layer 1062 at the top is not easily damaged. When the semiconductor structure is working, the channel layer 1062 is used as a channel, and the formation quality of the channel layer 1062 is relatively good, which is conducive to increasing the mobility of carriers in the channel.

It should be noted that the method for forming a semiconductor structure includes: removing the spacer layer 1032 after the channel stack 106 is formed.

The spacer layer 1032 is removed to be prepared for the subsequent formation of the gate structure.

In some implementations, the spacer layer 1032 is removed using a wet etching process. The wet etching process is an isotropic etching process, and the wet etching process has a relatively high etching rate, simple operation, and low process costs.

A material of the spacer layer 1032 is silicon nitride, and a corresponding wet etching solution is phosphoric acid solution.

The method for forming a semiconductor structure includes: removing the mask layer 101 after removing the spacer layer 1032.

The mask layer 101 is removed to be prepared for the subsequent formation of the gate structure.

In some implementations, the mask layer 101 is removed by a wet etching process. The wet etching process is an isotropic etching process, and the wet etching process has a relatively high etching rate, simple operation, and low process costs.

A material of the mask layer 101 is silicon nitride, and a corresponding wet etching solution is phosphoric acid solution.

Figure 12:
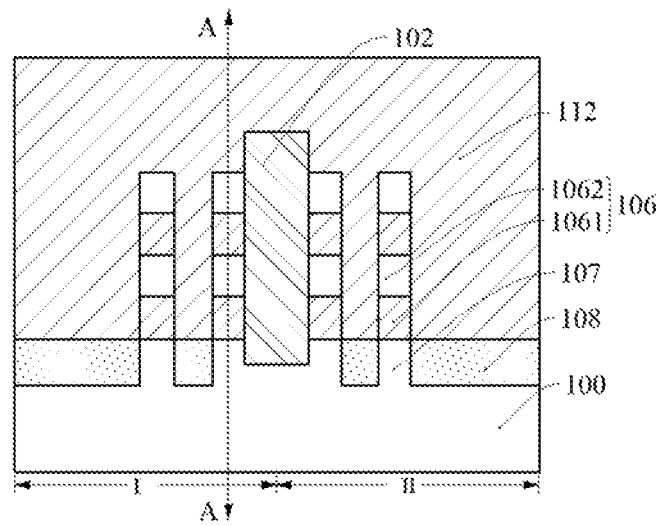
Figure 13:
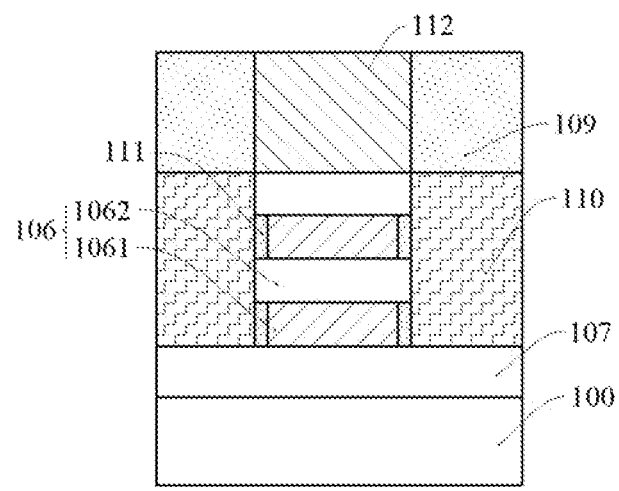

Referring to FIG. 12 and FIG. 13, FIG. 13 is a cross-sectional view of FIG. 12 along line A-A. The method for forming a semiconductor structure includes: after the channel stack 106 is formed, forming a gate structure 112 across the channel stack 106, the gate structure 112 covering part of a top wall and part of a side wall of the channel stack 106.

The gate structure 112 occupies space for formation of the metal gate structure in the subsequent process.

In some implementations, the gate structure 112 includes a dummy gate oxide layer (not shown in the figure) that conformally covers part of the top wall and part of the side wall of the channel stack 106 and a dummy gate layer (not shown in the figure) on the dummy gate oxide layer.

In some implementations, a material of the dummy gate oxide layer is silicon oxide. In other implementations, the material of the dummy gate oxide layer may alternatively be silicon oxynitride.

In some implementations, a material of the dummy gate layer is polysilicon. In other implementations, the material of the dummy gate layer may alternatively be amorphous carbon.

Referring to FIG. 13 again, a trench (not shown in the figure) is formed in the channel stacks 106 on two sides of the gate structure of the first device region I and the second device region II, and a source/drain doped layer 110 is formed in the trench.

In some implementations, the dielectric wall 102 is formed at the boundary between the first device region I and the second device region II, and the source/drain doped layer 110 is formed after the dielectric wall 102 is formed. Therefore, the source/drain doped layer 110 of the first device region I and the source/drain doped layer 110 of the second device region II can be well electrically isolated by the dielectric wall 102, and the source/drain doped layer 110 in the first device region I and the source/drain doped layer 110 in the second device region II are not prone to bridging, which is conducive to improving the electrical performance of the semiconductor structure.

When the semiconductor structure is working, the source/drain doped layer 110 is used to provide stress to the channel and increase the mobility of carriers in the channel.

In some implementations, the first device region I is used for forming a PMOS thereon. When the semiconductor structure is working, the source/drain doped layer 110 of the first device region I applies tensile stress to the channel below the gate structure. The electronic mobility can be improved by stretching the channel. Specifically, a material of the source/drain doped layer 110 in the first device region I is silicon carbide, silicon phosphide or silicon doped with N-type ions. Specifically, the N-type ions include one or more of P, As, and Sb.

The second device region II is used for forming a PMOS thereon. When the semiconductor structure is working, the source/drain doped layer 110 of the second device region II applies compression stress to the channel below the gate structure. The hole mobility can be improved by compressing the channel. Specifically, a material of the source/drain doped layer 110 in the second device region II is silicon germanium or silicon doped with P-type ions. Specifically, the P-type ions include one or more of B, Ga and In.

The step of forming the source/drain doped layer 110 in the channel stacks 106 on two sides of the dielectric wall 102 includes: forming a trench (not shown in the figure) in the channel stacks 106 on two sides of the gate structure 112; and forming the source/drain doped layer 110 in the trench.

The trench provides space for forming the source/drain doped layer.

The step of forming the trench includes: etching the channel stacks 106 on two sides of the gate structure 112 to form the trench.

In some implementations, the channel stack 106 is etched using a dry etching process. The dry etching process has the anisotropic etching characteristics and has relatively good control performance of etching a profile, which is conducive to making the morphology of the trench meet the process requirement, thereby providing a sound process window for the formation of the source/drain doped layer.

It should be noted that in the step of forming the trench, the trench exposes a top of the fin 107.

The step of forming the source/drain doped layer 110 includes: forming an epitaxial layer (not shown in the figure) in the trench by using a selective epitaxy growth (SEG) process, and performing ion doping on the epitaxial layer to form the source/drain doped layer 110. The epitaxial layer is formed using the SEG process, and a film thereof has high purity, few growth defects, and high formation quality, which is conducive to optimizing the performance of the semiconductor structure.

In some implementations, ion doping is performed on the epitaxial layer using an in-situ self-doping process to form the source/drain doped layer 110. By using the in-situ self-doping method, it is conducive to improving the uniformity of the doping ion concentration in the source/drain doped layer 110, thereby improving the quality and the performance of the source/drain doped layer 110. In other implementations, after the epitaxial layer is formed, the epitaxial layer may be ion-doped in a manner of ion implantation, to form the source/drain doped layer.

The method for forming a semiconductor structure further includes: after the trench is formed and before the source/drain doped layer 110 is formed, in the extension direction of the dielectric wall 102, removing a part of the sacrificial layer 1061 exposed by a side wall of the trench to form a first side trench (not shown in the figure) surrounded by a channel layer 1062, a fin 107, and a sacrificial layer 1061, and a second side trench (not shown in the figure) surrounded by the channel layer 1062 and the sacrificial layer 1061; and forming an inner spacer layer 111 respectively in the first side trench and in the second side trench.

The inner spacer layer 111 is used to reduce a capacitive coupling effect between the subsequently formed source/drain doped layer and the subsequently formed metal gate structure, thereby reducing the parasitic capacitance and improving the electrical performance of the transistor structure.

In some implementations, a material of the inner spacer layer 111 includes one or more of SiON, SiBCN, SiCN, carbon-doped SiN and oxygen-doped SiN.

Implementations of the method for forming the semiconductor structure further includes: forming an interlayer dielectric layer 109 covering the source/drain doped layer 110 and exposing a top of the gate structure 112 after the source/drain doped layer 110 is formed.

The interlayer dielectric layer 109 is used to electrically isolate adjacent devices.

In some implementations, a material of the interlayer dielectric layer 109 is an insulating material. Specifically, in some implementations, the material of the interlayer dielectric layer 109 is silicon oxide.

Figure 14:
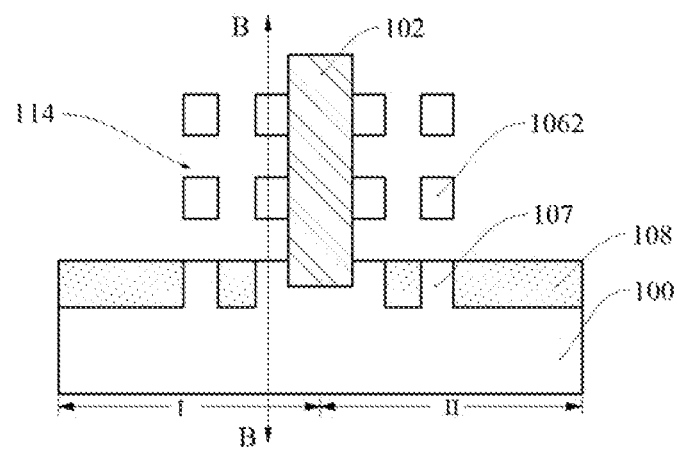
Figure 15:
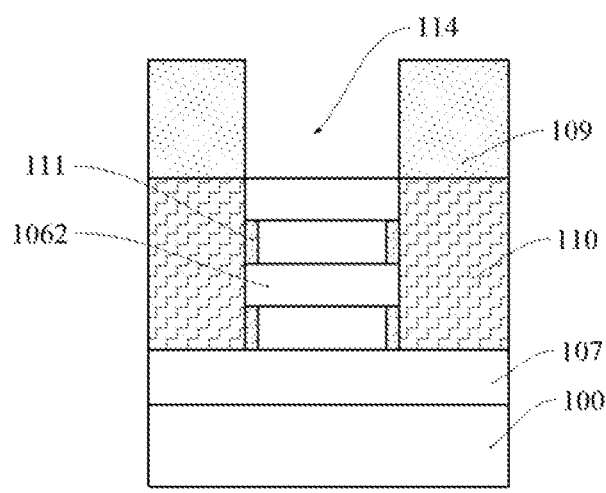

Referring to FIG. 14 and FIG. 15, FIG. 15 is a cross-sectional view of FIG. 14 in a B-B direction. The gate structure 112 and the sacrificial layer 1061 are removed to form a gate opening 114.

The gate opening 114 provides space for the subsequent formation of a metal gate structure.

In some implementations, the sacrificial layer 1061 is removed using a wet etching process. The wet etching process is an isotropic etching process, which has the characteristics of a fast etching rate, simple operation, and low costs.

A material of the sacrificial layer 1061 is silicon germanium, and a corresponding wet etching solution includes hydrogen chloride solution.

In some implementations, the gate structure 112 is removed using a wet etching process. The wet etching process is an isotropic etching process, which has the characteristics of a fast etching rate, simple operation, and low costs.

A material of the gate structure 112 includes a dummy gate oxide layer and a dummy gate layer. A material of the dummy gate oxide layer is silicon oxide, and a material of the dummy gate layer is polysilicon. The corresponding wet etching solution includes hydrogen fluoride and TMAH.

Figure 16:
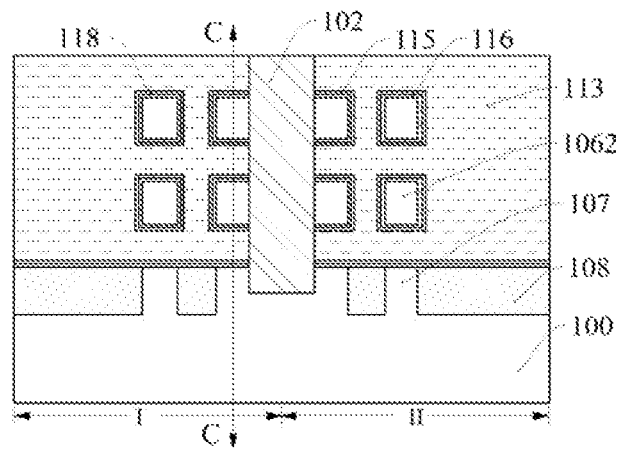
Figure 17:
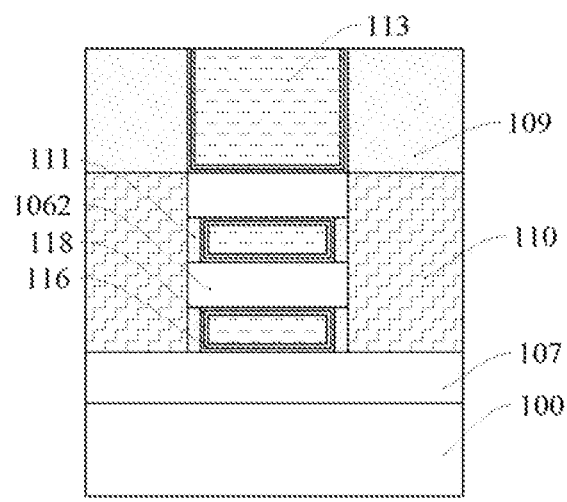

Referring to FIG. 16 and FIG. 17, FIG. 17 is a schematic diagram of a C-C cross section of FIG. 16, and a metal gate structure that completely surrounds the channel layer 1062 is formed in the gate opening 114.

When the semiconductor structure is working, the metal gate structure is used to control the opening and closing of the channel.

The metal gate structure of the first device region I includes a metal gate layer 113 and a first work function layer 118, and the metal gate structure of the second device region II includes a metal gate layer 113 and a second work function layer 117.

In some implementations, a material of the metal gate layer 113 includes a magnesium-tungsten alloy. In other implementations, the material of the metal gate layer may alternatively be W, Al, Cu, Ag, Au, Pt, Ni, Ti, or the like.

In some implementations, the metal gate layer 113 is formed using an atomic layer deposition process. In other implementations, the metal gate layer may alternatively be formed using an electrochemical plating process.

The step of forming a metal gate structure completely surrounding the channel layer 1062 includes: forming a first work function layer 118 on a surface of the channel layer 1062 of the first device region I and the second device region II; after the first work function layer 118 is formed, removing the first work function layer 118 from the second device region II; after the first work function layer 118 in the second device region II is removed, forming a second work function layer 115 on the surface of the channel layer 1062 in the second device region II; and after the second work function layer 115 is formed, forming a metal gate layer 113 surrounding the channel layer 1062, the first work function layer 118 and the second work function layer 115, the first work function layer 118 and the metal gate layer 113 being used as the metal gate structure of the first device region I, and the second work function layer 115 and the metal gate layer 113 being used as the metal gate structure of the second device region II.

The step of removing the first work function layer 118 from the second device region II includes: forming a work function mask layer covering the first device region I and part of the dielectric wall 102 and exposing the second device region II; and using the work function mask layer and the dielectric wall 102 as masks, to remove the first work function layer 118 from the second device region II. The method for forming a semiconductor structure further includes: after the second work function layer 115 is formed on the surface of the channel layer 1062 in the second device region II, removing the work function mask layer.

The work function mask layer may cover part of or the entirety of the dielectric wall 102. Even if there is an overlay error in the process of forming the work function mask layer, the work function mask layer can easily completely cover the first device region I and expose the second device region II, and the dielectric wall 102 enlarges the process window formed by the work function mask layer. In the process of removing the first work function layer 118 from the second device region II, the first work function layer 118 in the first device region I is not easily damaged. The first work function layer 118 can well adjust the threshold voltage of the first-type transistor. The first work function layer 118 in the second device region II can be removed clearly. The second work function layer 115 can well adjust the threshold voltage of the second-type transistor, which is conducive to improving the electrical performance of the semiconductor structure.

It should be noted that in the step of forming the metal gate structure, the metal gate structure is formed in the gate opening 114.

The method for forming a semiconductor structure further includes: after the gate opening 114 is formed, and before the first work function layer 118 is formed, conformally covering the gate dielectric layer 116 in the gate opening 114.

The gate dielectric layer 116 is used to electrically isolate the subsequently formed metal gate structure from the channel layer 1022. It should be noted that a material of the gate dielectric layer 116 is a high-K dielectric material. The high-k dielectric material refers to a dielectric material having a relative dielectric constant greater than a relative dielectric constant of silicon oxide.

In some implementations, the material of the gate dielectric layer 116 is $HfO_2$. In other implementations, the material of the gate dielectric layer is alternatively one or more of $ZrO_2$, HfSiO, HfSiON, HfTaO, HfTiO, HfZrO or $AL_2O_3$.

Another form of the present disclosure further provides a semiconductor structure. FIG. 10 is a schematic structural diagram of one form of a semiconductor structure according to the present disclosure.

The semiconductor structure includes: an initial substrate 200, the initial substrate 200 including a first device region I and a second device region II; the initial channel stack 201, located on the initial substrate 200; the dielectric wall 102, running through the initial channel stack 201 at the boundary between the first device region I and the second device region II; and the spacer layer 1032, separated on the initial channel stack 201, the spacer layer 1032 exposing the dielectric wall 102.

In the semiconductor structure, the dielectric wall 102 runs through the initial channel stack 201 at the boundary between the first device region I and the second device region II, and the dielectric wall 102 electrically isolates the initial channel stack 201 of the first device region I and the second device region II. Subsequently, the initial channel stack 201 is etched using the spacer layer 1032 as a mask to form a separate channel stack. The channel stack is formed using the spacer layer 1032 as a mask, and thus, the channel stack has good morphology uniformity, which is conducive to improving the uniformity of the semiconductor structure performance. In addition, usually after the channel stack is formed, a source/drain doped layer is formed in the channel stacks on two sides of the dielectric wall. Because the source/drain doped layer is formed after the dielectric wall 102, the source/drain doped layer in the first device region I and the source/drain doped layer in the second device region II can be well electrically isolated by the dielectric wall 102, and the source/drain doped layer in the first device region I and the source/drain doped layer in the second device region II are not easily bridged, which is conducive to improving the electrical performance of the semiconductor structure.

In some implementations, the first device region I is used for forming a first-type transistor thereon, and the second device region II is used for forming a second-type transistor thereon. Conductivity types of the first-type transistor and the second-type transistor are different. Specifically, the first-type transistor is a PMOS, and the second-type transistor is an NMOS.

The initial substrate 200 is prepared for the subsequent formation of a substrate.

In some implementations, the initial substrate 200 is a silicon substrate. In other implementations, a material of the initial substrate may also be another material such as germanium, silicon germanium, silicon carbide, gallium arsenide, or indium gallium. The initial substrate may alternatively be an initial substrate of another type, including a silicon initial substrate on an insulator or a germanium initial substrate on an insulator.

The initial channel stack 201 is prepared for the subsequent formation of a channel stack. Specifically, the channel material layer 2012 is prepared for the subsequent formation of a channel layer, and the sacrificial material layer 2011 is prepared for the subsequent formation of a sacrificial layer.

In some implementations, the etching difficulty of the channel material layer 2012 is greater than that of the sacrificial material layer 2011. The channel material layer 2012 is subsequently etched to form the channel layer, and the sacrificial material layer 2011 is etched to form the sacrificial layer. When the sacrificial layer is removed, the channel layer is not easily damaged.

In some implementations, a material of the channel material layer 2012 is silicon. A material of the sacrificial material layer 2011 is silicon germanium. In other implementations, the material of the channel material layer may alternatively be another material such as germanium, silicon germanium, silicon carbide, gallium arsenide, or indium gallium, and the material of the sacrificial material layer may alternatively correspondingly be silicon.

The spacer layer 1032 is used as an etching mask for subsequent etching the initial channel stack 201.

Specifically, a material of the spacer layer 1032 includes one or more of silicon nitride, silicon oxynitride, silicon carbide, silicon carbonitride, boron nitride, boron nitride silicon, and boron carbon silicon nitride. In some implementations, the material of the spacer layer 1032 includes silicon nitride.

The semiconductor structure further includes a mask layer 101, located between the initial channel stack 201 and the spacer layer 1032.

In the step of forming the dielectric wall 102, the mask layer 101 protects the top of the initial channel stack 201 from being damaged. The top of the initial channel stack 201 is the channel material layer 2012, and the channel material layer 2012 is subsequently etched to form the channel layer. The corresponding channel layer is not easily damaged.

Specifically, a material of the mask layer 101 includes one or more of silicon nitride, silicon oxynitride, silicon carbide, silicon carbonitride, boron nitride, boron nitride silicon, and boron carbon silicon nitride. In some implementations, the material of the mask layer 101 includes silicon nitride.

In some implementations, a material of the dielectric wall 102 is a low-k dielectric material. (The low-k dielectric material refers to a dielectric material with a relative dielectric constant greater than or equal to 2.6 and less than or equal to 3.9.) The low-k dielectric material has superior insulation performance, so that after the gate structure is replaced with a metal gate structure subsequently, the capacitive coupling effect between the metal gate structure in the first-type transistor and the metal gate structure in the second-type transistor is relatively weak, which is conducive to improving the electrical performance of the second-type transistor.

Specifically, the material of the dielectric wall 102 includes one or more of SiON, SiBCN, SiCN, carbon-doped SiN and oxygen-doped SiN. In some implementations, the material of the dielectric wall 102 includes carbon-doped SiN or oxygen-doped SiN.

It should be noted that in a surface normal direction of the initial substrate 200, a side wall of the dielectric wall 102 is flush with a side wall of the spacer layer 1032.

In the surface normal direction of the initial substrate 200, the side wall of the dielectric wall 102 is flush with the side wall of the spacer layer 103, which is conducive to improving the plane utilization of the surface of the initial substrate 200, improving the integration degree of the semiconductor structure, and reducing the energy consumption of the semiconductor structure.

The semiconductor structure may be formed using implementations of the forming method described above, or may be formed using another forming method. For specific descriptions for the semiconductor structure in this form, reference may be made to corresponding descriptions in the foregoing embodiments and implementations. Details are not described herein again in this implementation.

Although embodiments and implementations of the present disclosure are disclosed as above, the embodiments and implementations of the present disclosure are not limited thereto. Any person skilled in the art can make various changes and modifications without departing from the spirit and scope of the embodiments and implementations of the present disclosure. Therefore, the protection scope of the embodiments and implementations of the present disclosure should be subject to the scope defined by the claims.

What is claimed is:

1. A method for forming a semiconductor structure, wherein the method comprises:
    providing a base comprising:
        a first device region and a second device region,
        an initial substrate, and
        an initial channel stack located on the initial substrate, the initial channel stack comprising a sacrificial material layer and a channel material layer located on the sacrificial material layer;
    forming a discrete combined pattern on the initial channel stack, the combined pattern comprising a mandrel layer and a spacer layer located on a side wall of the mandrel layer, where the combined pattern exposes a boundary between the first device region and the second device region;
    after the combined pattern is formed, forming a dielectric wall running through the initial channel stack at the boundary between the first device region and the second device region;
    after the dielectric wall is formed, removing the mandrel layer; and
    etching the initial channel stack using the spacer layer as a mask to form a separate channel stack and expose side walls of the separate channel stack, the separate channel stack comprising a sacrificial layer and a channel layer located on the sacrificial layer.

2. The method according to claim 1, wherein the step of forming the combined pattern comprises:
    forming a mandrel material layer on the initial channel stack;
    patterning the mandrel material layer to form a separate mandrel layer;
    forming a spacer material layer on the mandrel layer and the initial channel stack exposed by the mandrel layer; and
    removing the spacer material layer from a top of the mandrel layer and the initial channel stack, and using the remaining spacer material layer on the side wall of the mandrel layer as the spacer layer.

3. The method according to claim 2, wherein the spacer material layer is formed using an atomic layer deposition process or a chemical vapor deposition process.

4. The method according to claim 1, wherein a material of the spacer layer comprises: at least one of silicon nitride, silicon oxynitride, silicon carbide, silicon carbonitride, boron nitride, boron nitride silicon or boron carbon silicon nitride.

5. The method according to claim 1, wherein a material of the dielectric wall is a low-k dielectric material.

6. The method according to claim 1, wherein the material of the dielectric wall comprises at least one of SiON, SiBCN, SiCN, carbon-doped SiN or oxygen-doped SiN.

7. The method according to claim 1, wherein in the step of forming a dielectric wall running through the initial channel stack at the boundary between the first device region and the second device region, in a surface normal direction of the initial substrate, a side wall of the dielectric wall is flush with a side wall of the spacer layer.

8. The method according to claim 1, wherein the step of forming the dielectric wall comprises:
    forming a shielding layer on the initial channel stack, the shielding layer covering the combined pattern and exposing the boundary between the first device region and the second device region;
    etching the initial channel stack using the shielding layer as a mask to form an opening running through the initial channel stack;
    forming a dielectric material layer in the opening and on the initial channel stack; and
    removing the dielectric material layer exposing the opening, the remaining dielectric material layer located in the opening being used as the dielectric wall.

9. The method according to claim 8, wherein the initial channel stack at the boundary between the first device region and the second device region is etched using the shielding layer as a mask and using an anisotropic dry etching process, to form the opening.

10. The method according to claim 8, wherein the dielectric material layer is formed using a plasma chemical vapor deposition process or an atomic layer deposition process.

11. The method according to claim 8, wherein the dry etching process is used to remove the dielectric material layer exposing the opening.

12. The method according to claim 1, wherein the initial channel stack is etched using the spacer layer as a mask and using a dry etching process to form a separate channel stack.

13. The method according to claim 1, wherein the method comprises:
    after the initial channel stack is formed, forming a gate structure across the initial channel stack, the gate structure covering part of a top wall and part of a side wall of the initial channel stack;

forming a trench in the channel stacks on two sides of the gate structure of the first device region and the second device region; and forming a source/drain doped layer in the trench.

14. The method according to claim 13, wherein the method further comprises:
    forming an interlayer dielectric layer covering the source/drain doped layer and exposing a top of the gate structure;
    removing the gate structure and the sacrificial layer to form a gate opening; and
    forming a metal gate structure surrounding the channel layer in the gate opening.

15. The method according to claim 14, wherein the step of forming a metal gate structure surrounding the channel layer comprises:
    forming a first work function layer on a surface of the channel layer of the first device region and the second device region;
    after the first work function layer is formed, removing the first work function layer from the second device region;
    after the first work function layer in the second device region is removed, forming a second work function layer on the surface of the channel layer in the second device region; and
    after the second work function layer is formed, forming a metal gate layer surrounding the channel layer, the first work function layer, and the second work function layer, the first work function layer and the metal gate layer being used as the metal gate structure of the first device region, and the second work function layer and the metal gate layer being used as the metal gate structure of the second device region.

16. The method according to claim 1, wherein in the step of forming the dielectric wall, the dielectric wall is further formed in the initial substrate; and
    in the step of etching the initial channel stack to form the separate channel stack, a partial thickness of the initial substrate is further etched to form a substrate and a fin located on the substrate, and the channel stack is formed on the fin.

* * * * *